(12) United States Patent
Hayano

(10) Patent No.: US 8,937,793 B2
(45) Date of Patent: Jan. 20, 2015

(54) SEMICONDUCTOR DEVICE

(75) Inventor: Kiminori Hayano, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 53 days.

(21) Appl. No.: 13/553,746

(22) Filed: Jul. 19, 2012

(65) Prior Publication Data

US 2013/0027824 A1 Jan. 31, 2013

(30) Foreign Application Priority Data

Jul. 28, 2011 (JP) ................................. 2011-164917

(51) Int. Cl.
*H02H 3/22* (2006.01)
*H01L 27/02* (2006.01)
*H03K 19/003* (2006.01)

(52) U.S. Cl.
CPC ...... *H01L 27/0292* (2013.01); *H03K 19/00315* (2013.01)
USPC ............................................ 361/56; 361/111

(58) Field of Classification Search
USPC .................................................. 361/56, 111
See application file for complete search history.

(56) References Cited

U.S. PATENT DOCUMENTS

| 5,991,135 | A * | 11/1999 | Saleh ................................ 361/56 |
| 6,518,608 | B1 | 2/2003 | Takizawa |
| 6,785,109 | B1 | 8/2004 | Huang et al. |
| 7,110,228 | B2 * | 9/2006 | Chang ............................ 361/56 |
| 2004/0195625 | A1 | 10/2004 | Ichikawa |
| 2006/0114047 | A1 * | 6/2006 | Irino ............................. 327/328 |
| 2008/0080107 | A1 | 4/2008 | Chow et al. |

FOREIGN PATENT DOCUMENTS

| JP | 2004-304136 A | 10/2004 |
| JP | 2010-205871 A | 9/2010 |
| WO | WO 03/007380 A1 | 1/2003 |

OTHER PUBLICATIONS

European Search Report dated Oct. 24, 2012.

* cited by examiner

*Primary Examiner* — Danny Nguyen
(74) *Attorney, Agent, or Firm* — McGinn IP Law Group, PLLC

(57) ABSTRACT

A semiconductor device comprises a first power supply system, a second power supply system, an output circuit, a first driving circuit and a first protection. The first power supply system is configured with a first power supply voltage and a first ground voltage. The second power supply system is configured with a second power supply voltage and a second ground voltage. The output circuit receives a power supply from the second power supply system. The first driving circuit receives a power supply from the first power supply system and outputs a signal for driving the output circuit. One end of the first protection element is connected to an output node of the output circuit and the other end is connected to the first ground voltage.

22 Claims, 12 Drawing Sheets

SEMICONDUCTOR DEVICE

REFERENCE TO RELATED APPLICATION

This application is based upon and claims the benefit of the priority of Japanese patent application No. 2011-164917, filed on Jul. 28, 2011, the disclosure of which is incorporated herein in its entirety by reference thereto.

TECHNICAL FIELD

The present invention relates to a semiconductor device. More specifically, the invention relates to a semiconductor device including an electrostatic protection circuit.

BACKGROUND

In a semiconductor device, absolute maximum rating of a power supply voltage is set. When a voltage exceeding this absolute maximum rating is applied to the semiconductor device, the semiconductor device may be broken down. As such a case where the voltage exceeding the absolute maximum rating is applied to the semiconductor device, an ESD (Electro Static Discharge) that enters the semiconductor device from an outside of the semiconductor device may be pointed out.

Patent Literature 1 discloses a technique of employing a GGNMOS (Gate Grounded NMOS) transistor where a gate, a source, and a substrate potential of an N-channel type MOS transistor are connected to a ground potential, as an ESD protection circuit.

Further, Patent Literature 2 discloses a technique of employing a diode element connected between terminals of different power supply systems as an ESD protection circuit, in a semiconductor device including the different power supply systems.

[Patent Literature 1]
JP Patent Kokai Publication No. JP-2004-304136A, which corresponds to US2004/195625A1
[Patent Literature 2]
JP Patent Kokai Publication No. JP-2010-205871A

SUMMARY

The disclosures of the above Patent Literatures are incorporated herein in their entirety by reference thereto. The following analysis is given by the present invention.

Various proposals have been made for an ESD protection circuit for a semiconductor device, as described above. In both cases, however, the semiconductor device may be broken down by static electricity.

The GGNMOS transistor disclosed in Patent Literature 1 is effective for electrostatic protection of a circuit that receives a power supply from a same power supply system. However, the GGNMOS transistor has a problem when used for protecting a circuit connected to different power supply systems. That is, the GGNMOS transistor alone disclosed in Patent Literature 1 is not effective for static electricity to be applied through nodes that interconnect the circuit disposed at a boundary between the different power supply systems.

Even if the ESD protection circuit (diode element) disclosed in Patent Literature 2 is used, an output transistor may be broken down by static electricity when the semiconductor device includes the different power supply systems and the power supply system of an output circuit including the output transistor is different from the power supply system of a circuit for driving the output circuit. When an output pad for outputting a signal is formed at a location separated from the diode element, a resistance value on a discharge path will increase, and influence of the increase in the resistance value will come out. As a result, the output transistor included in the semiconductor device may be broken down by the static electricity. The reason why the output transistor is broken down when the power supply system of the output circuit including the output transistor is different from the power supply system of the circuit for driving the output circuit will be described later.

As described above, there is a problem to be solved in an ESD protection circuit for an output transistor in a semiconductor device including different power supply systems. For that reason, there is desired a semiconductor device including different power supply systems, in which a protection element for protecting an output transistor from electrostatic breakdown is provided.

According to a first aspect of the present invention, there is provided a semiconductor device comprising a first power supply system, a second power supply system, an output circuit, a first driving circuit and a first protection element. The first power supply system is configured with a first power supply voltage and a first ground voltage. The second power supply system is configured with a second power supply voltage and a second ground voltage. The output circuit receives a power supply from the second power supply system. The first driving circuit receives a power supply from the first power supply system and outputs a signal for driving the output circuit. One end of the first protection element is connected to an output node of the output circuit and the other end is connected to the first ground voltage.

According to a second aspect of the present invention, there is provided a semiconductor device comprising first to fifth pads, a first circuit, a second circuit and a first protection element. First to fifth pads are disposed on a semiconductor substrate. The first circuit is driven by a potential difference between the first and second pads, and controls a potential of a first node. The second circuit is driven by a potential difference between the third and fourth pads, and controls a potential of the fifth pad. The first protection element is connected between the second pad and the fifth pad.

According to each aspect of the present invention, there is provided a semiconductor device, in which a protection element for protecting an output transistor from electrostatic breakdown is provided.

PREFERRED MODES

First, overviews of exemplary embodiments will be described, using FIGS. 1 to 4.

Figure 1:
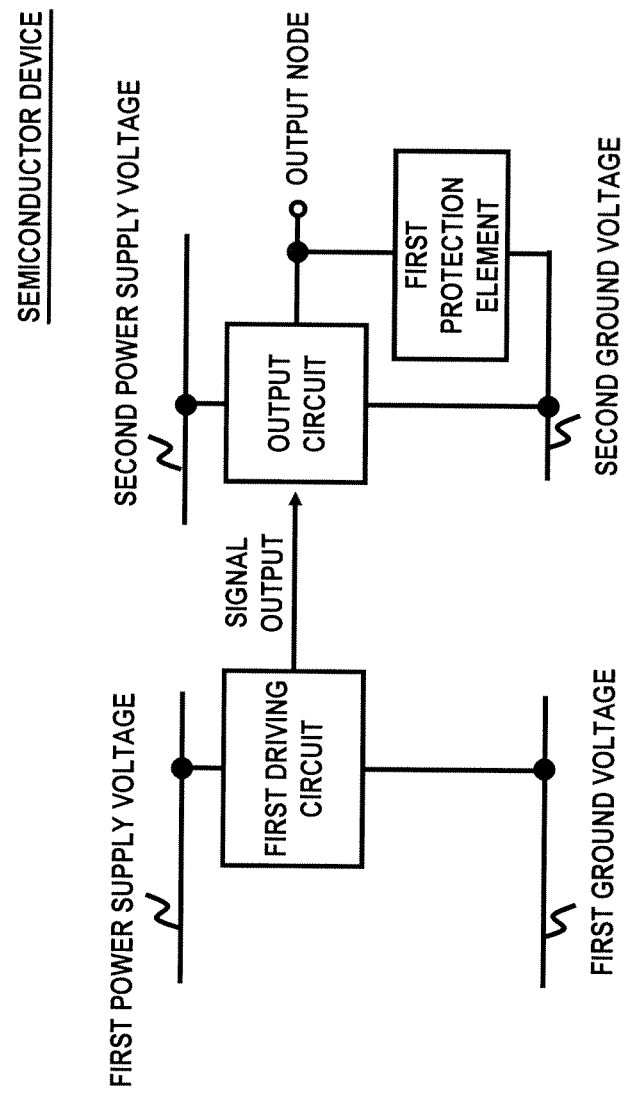
FIG. 1 is a diagram for explaining an overview of an exemplary embodiment of the present disclosure.

A semiconductor device shown in FIG. 1 includes a first power supply system, a second power supply system, an output circuit, a first driving circuit, and a first protection element. The first power supply system is configured with a first power supply voltage and a first ground voltage. The second power supply system is configured with a second power supply voltage and a second ground voltage. The output circuit receives a power supply from the second power supply system. The first driving circuit receives a power supply from the first power supply system and outputs a signal for driving the output circuit. One end of the first protection element is connected to an output node of the output circuit and the other end is connected to the second ground voltage.

Generally, the first and second power supply voltages and the first and second ground voltages are supplied from pads on a substrate. The output node is connected to a pad on the substrate to transfer a signal with an outside. Since such pads are exposed to the outside of the semiconductor device, static electricity may be applied. This may cause a high potential difference between the respective pads, leading to breakdown of an internal circuit when electric charges are discharged.

A protection element is an element that causes current to flow between two terminals when a potential difference between the two terminals is equal to or larger than a predetermined voltage (threshold voltage). That is, when the two terminals are connected to two nodes, the protection element causes the two nodes to be substantially nonconductive to each other until the potential difference between the two nodes reaches the threshold voltage. On the other hand, when the potential difference between the two nodes becomes equal to or larger than the threshold voltage, the protection element causes the two nodes to be conductive to each other. A diode (whose forward direction characteristic and backward direction characteristic can be both utilized) may be pointed out as such an element. Alternatively, as disclosed in Patent Literature 1, a field effect transistor with a gate electrode thereof connected to a source electrode thereof can be applied. Unless otherwise specified, the protection element is the same as defined above. When the first protection element is included as in the semiconductor device shown in FIG. 1, electric charges can be discharged to the second ground voltage when static electricity is applied at the output node.

However, this semiconductor device receives power supplies from the two power supply systems. Accordingly, a discharge path between the first driving circuit and the output circuit through a signal interconnect is present, with respect to the first ground voltage and the first power supply voltage. Especially in the case of a configuration in which an initial stage of the output circuit is constituted from a CMOS inverter or the like and which receives an output signal of the first driving circuit at a gate electrode of a field effect transistor, dielectric breakdown of the CMOS inverter in the initial stage of the output circuit may occur due to discharge on the discharge path.

Figure 2:
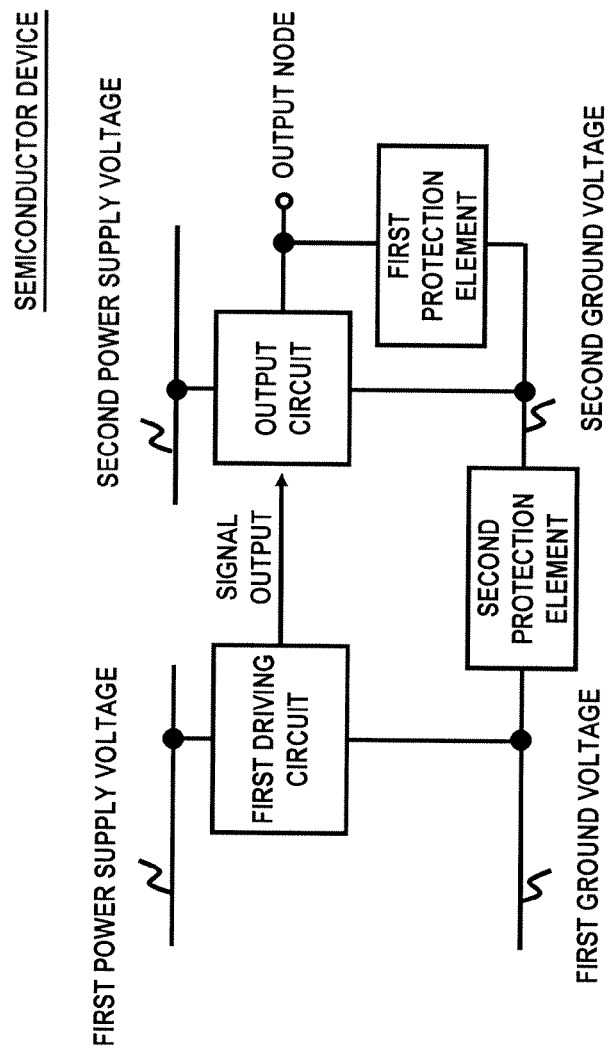
FIG. 2 is a diagram for explaining an overview of an exemplary embodiment of the present disclosure.

Then, a configuration, where a second protection element is provided between a first ground voltage and a second ground voltage as shown in FIG. 2, has been considered. The protection circuit may include a function equivalent to that of the above-mentioned protection element and may be formed of a plurality of protection elements. Due to the protection circuit as mentioned above, a path from an output node to the first ground voltage through the second protection element is formed. Thus, the above-mentioned breakdown of an output circuit can be suppressed. Further, when the first ground voltage and a first power supply voltage are connected by a different protection element or the like, for example, a discharge path from the output node to the first power supply voltage is also formed. According to a further study of the inventor of the present application, however, even if a protection element or the protection circuit is provided between the first ground voltage and the second ground voltage, sufficient discharge may not be able to be performed by the path using the second protection element when a second ground voltage interconnect extending from a first protection element for the output node to the second protection element is long or when the second protection element itself has a large resistance. Further, the protection element may not be able to be provided between the first ground voltage and the second ground voltage.

Figure 3:
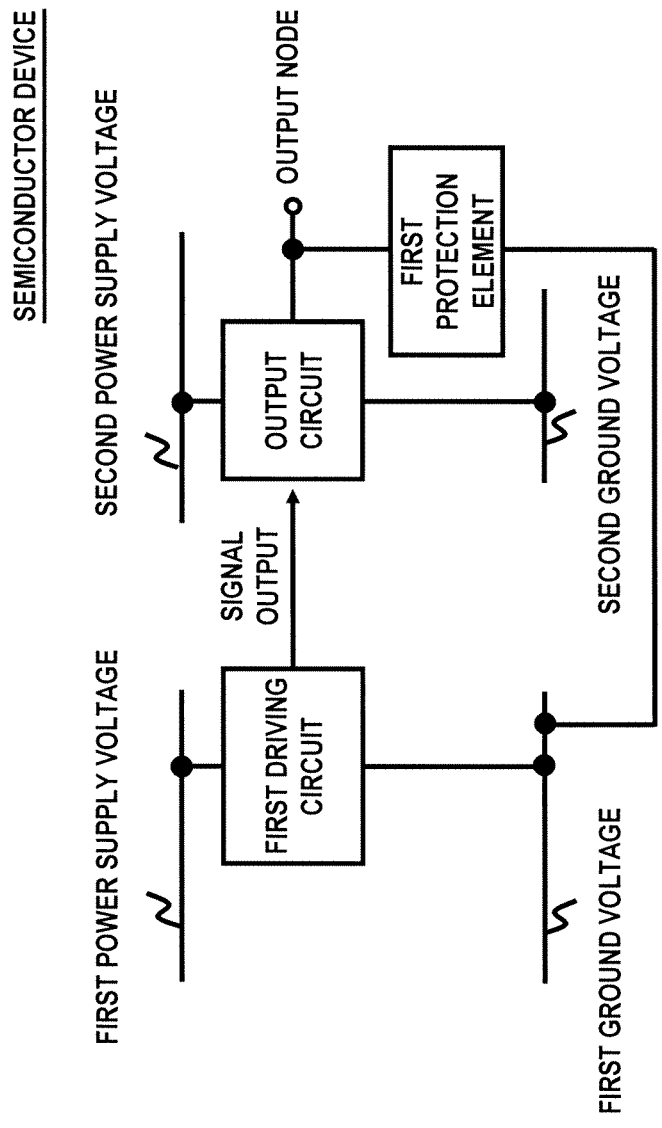
FIG. 3 is a diagram for explaining an overview of an exemplary embodiment of the present disclosure.
Figure 4:
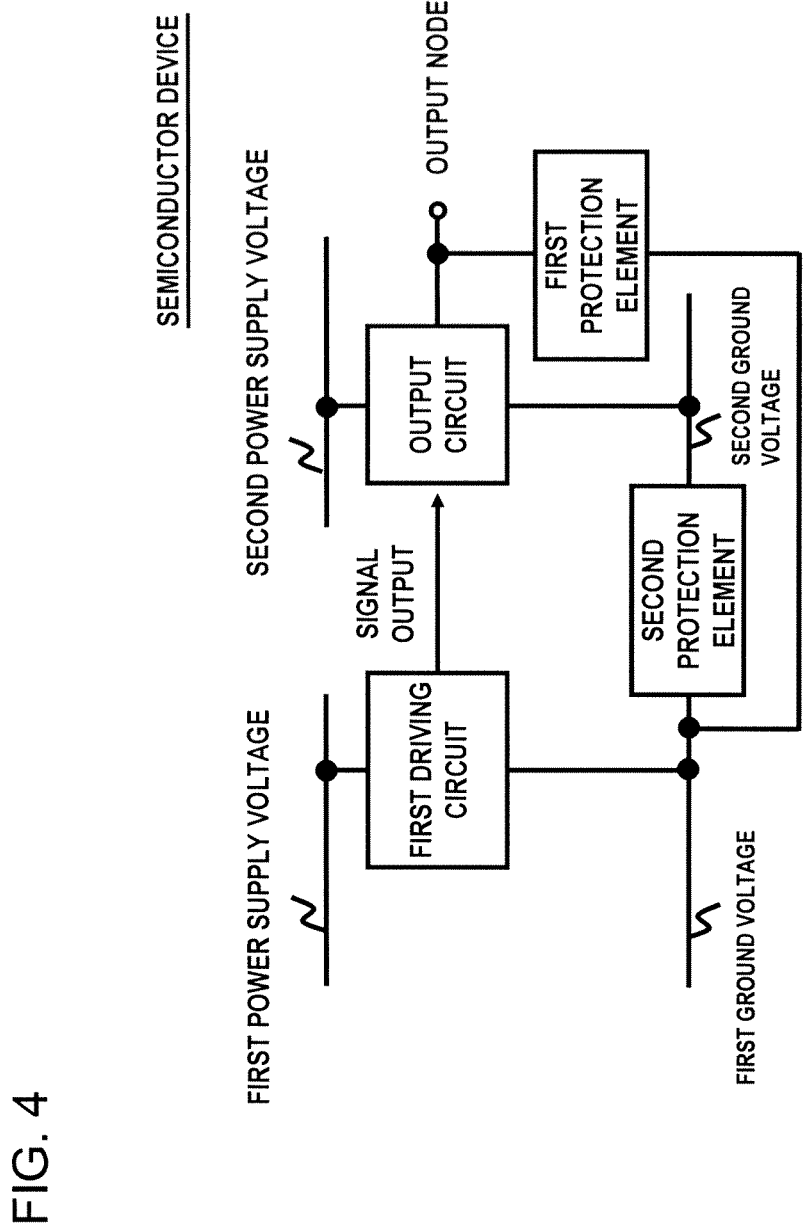
FIG. 4 is a diagram for explaining an overview of an exemplary embodiment of the present disclosure.

Then, a first protection element is connected between an output node and a first ground voltage, as shown in FIGS. 3 and 4. Due to such connection of the first protection element, a direct discharge path from the output node to the first ground voltage is formed. Then, even if a protection circuit cannot be provided between a first ground voltage interconnect and a second ground voltage interconnect, discharge can be performed without using a signal interconnect between a driving circuit and an output circuit (refer to FIG. 3). Further, when an interconnect extending from a second ground voltage interconnect to a second protection element is long, or when the second protection element itself has a large resistance, discharge can be directly performed from the output node to the first ground voltage (refer to FIG. 4). As a result, protection of an output circuit is more ensured.

Figure 5:
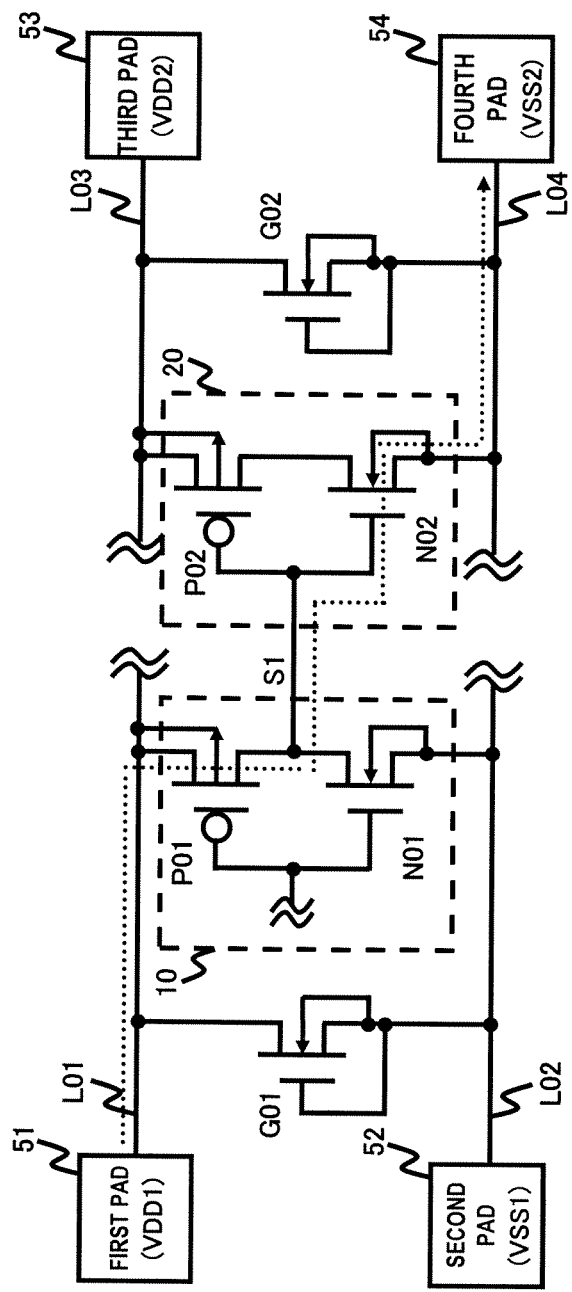
FIG. 5 is a diagram showing an example of a semiconductor device including different power supply systems and an ESD protection circuit for the semiconductor device.

FIG. 5 is a diagram showing an example of a semiconductor device including different power supply systems and an ESD protection circuit for the semiconductor device.

FIG. 5 includes a first circuit 10 connected to a first power supply system (configured with a power supply voltage VDD1 and a ground voltage VSS1) and a second circuit 20 connected to a second power supply system (configured with a power supply voltage VDD2 and a ground voltage VSS2).

The first circuit 10 is formed of an N-channel type MOS transistor N01 and a P-channel type MOS transistor P01. The second circuit 20 is formed of an N-channel type MOS transistor N02 and a P-channel type MOS transistor P02. Further, GGNMOS transistors G01 and G02 are respectively included as ESD protection circuits for respectively protecting the first circuit 10 and the second circuit 20 from static electricity. The first circuit 10 and the second circuit 20 are connected via a node S1.

In the following description, an interconnect for supplying a voltage from the power supply voltage VDD1 is set to a first power supply potential interconnect L01, an interconnect for supplying a voltage from the ground voltage VSS1 is set to a first ground potential interconnect L02, an interconnect for supplying a voltage from the power supply voltage VDD2 is set to a second power supply potential interconnect L03, and an interconnect for supplying a voltage from the ground voltage VSS2 is set to a second ground potential interconnect L04. A pad for receiving supply of the power supply voltage VDD1 is set to a first pad 51, a pad for receiving supply of the ground voltage VSS1 is set to a second pad 52, a pad for receiving supply of the power supply voltage VDD2 is set to a third pad 53, and a pad for receiving supply of the ground voltage VSS2 is set to a fourth pad 54. Further, a voltage to be supplied to each pad will be described in a bracket, in the following drawings.

When static electricity having a positive potential is applied between the first pad 51 and the fourth pad 54 in the semiconductor device shown in FIG. 5, static electricity discharges, using a path indicated by a dotted line in FIG. 5 because there is no discharge path between the first pad 51 and the fourth pad 54. The static electricity is discharged to the ground voltage VSS2 using the path through the P-channel type MOS transistor P01, the node S1, and the N-channel type MOS transistor N02. As a result, a voltage exceeding absolute maximum rating of the N-channel type MOS transistor N02 may be applied, leading to breakdown of the N-channel type MOS transistor N02.

Then, connection of an ESD protection circuit between the first ground potential interconnect L02 and the second ground potential interconnect L04, as disclosed in Patent Literature 2 may be considered.

Figure 6:
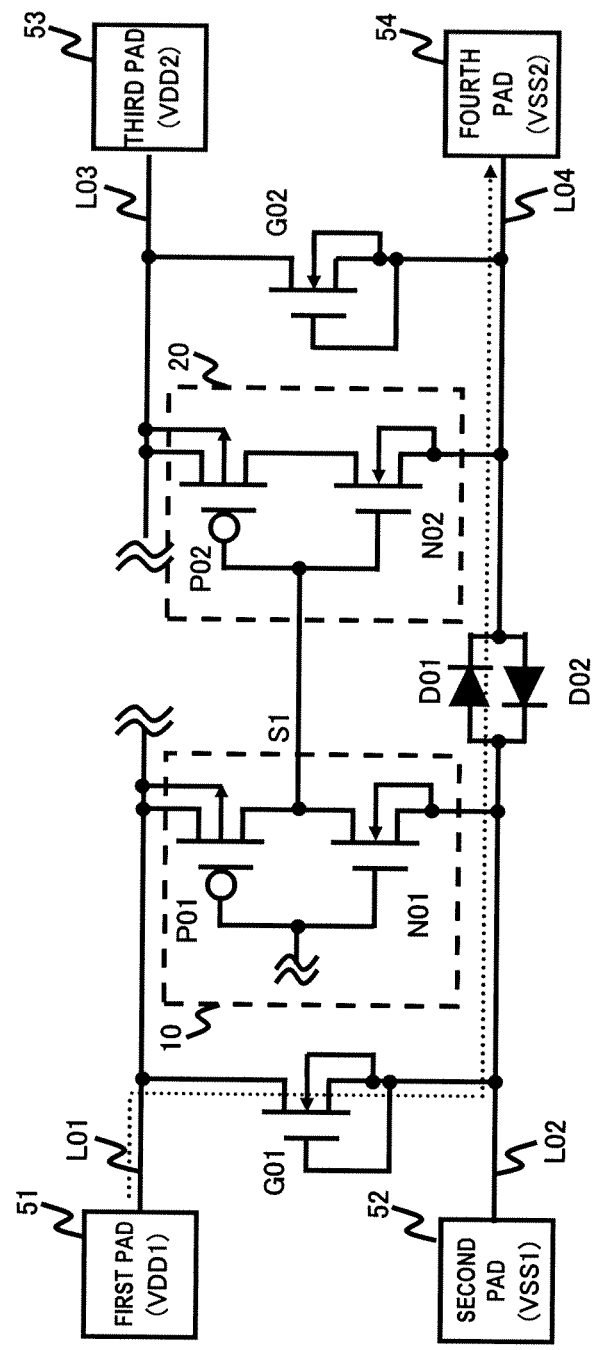
FIG. 6 is a diagram showing an example where an ESD protection circuit is added to the semiconductor device shown in FIG. 5.

FIG. 6 is a diagram when the ESD protection circuit is added to the semiconductor device shown in FIG. 5. Referring to FIG. 6, components that are the same as those of FIG. 5 are denoted by same reference symbols, and explanation of the same components will be omitted.

In the semiconductor device shown in FIG. 6, diodes D01 and D02 are bi-directionally connected between the first ground potential interconnect L02 and the second ground potential interconnect L04. The diodes D01 and D02 correspond to the above-mentioned second protection element.

When static electricity having a positive potential is applied between the first pad 51 and the fourth pad 54, the static electricity is discharged to the ground voltage VSS due to conduction of the GGNMOS transistor G01, and is then discharged to the ground voltage VSS2 through the diode D01 (using a path indicated by a dotted line in FIG. 6).

On the other hand, when static electricity having a negative potential is applied between the first pad 51 and the fourth pad 54, the static electricity is discharged to the first pad 51 for the power supply voltage VDD1 through the diode D02 and the GGNMOS transistor G01.

By bi-directionally connecting the diodes D01 and D02 between the first ground potential interconnect L02 and the second ground potential interconnect L04 as described above, the discharge paths are formed between the first pad 51 and the fourth pad 54 even if the static electricity has been applied between the first pad 51 and the fourth pad 54. Thus, the breakdown of the N-channel type MOS transistor N02 can be prevented. Even when static electricity is applied between the third pad 53 and the second pad 52, a discharge path is formed between the third pad 53 and the second pad 52, by the GGNMOS transistor G02 and the diode D02.

However, even if the ESD protection circuit (formed of the diodes D01 and D02) shown in FIG. 6 has been inserted, the discharge path shown in FIG. 5 may be formed when the discharge path indicated by the dotted line in FIG. 6 has a high resistance. For that reason, it is necessary to design the semiconductor device so that the discharge path shown in FIG. 6 has a low resistance. More specifically, the semiconductor device is designed so that sizes of the GGNMOS transistor G01, the diode D01, and the diode D02 are increased and each of the first ground potential interconnect L02 and the second ground potential interconnect L04 has a low resistance.

By bi-directionally connecting the diodes D01 and D02 between the second pad 52 and the fourth pad 54 as described above, the discharge paths can be formed even in the semiconductor device having the different power supply systems. As a result, even if a circuit connected to a boundary between the different power supply systems is present in order to transfer a signal, the circuit can be protected from electrostatic breakdown.

However, when an output circuit including an output transistor is connected to the second power supply system and a portion of a circuit for driving the output circuit is connected to the first power supply system in the semiconductor device having the different power supply systems, the ESD protection circuits containing the GGNMOS transistors G01 and G02 the diodes D01 and D02 may not be able to protect electrostatic breakdown.

Figure 7:
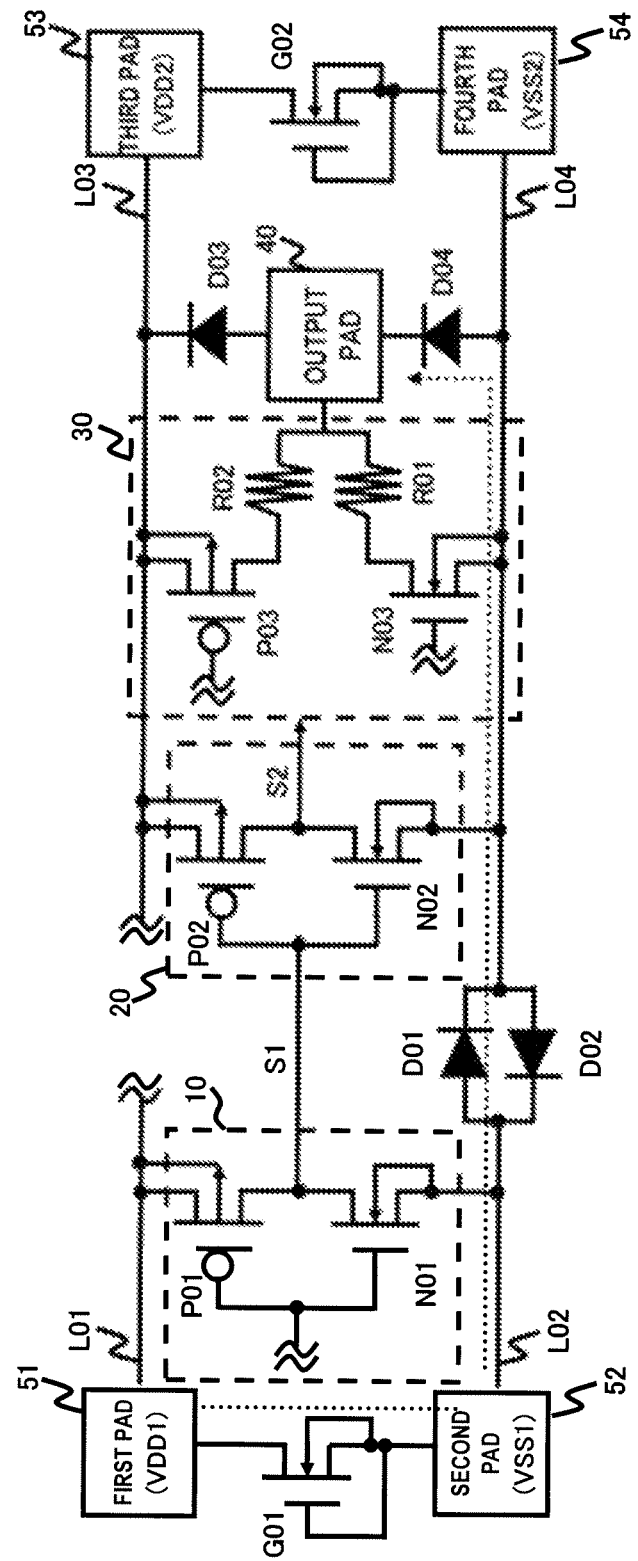
FIG. 7 is a diagram showing an example of a configuration of the semiconductor device shown in FIG. 6 when the semiconductor device includes an output circuit.

FIG. 7 is a diagram showing an example of a configuration where the semiconductor device shown in FIG. 6 includes the output circuit. Components in FIG. 7 that are the same as those in FIG. 6 are denoted by the same reference symbols, and description of the components in FIG. 7 that are the same as those in FIG. 6 will be omitted.

An output circuit 30 shown in FIG. 7 includes an N-channel type MOS transistor N03 and a P-channel type MOS transistor P03, as output transistors. The N-channel type MOS transistor N03 is connected to an output pad 40 through a resistor R01. The P-channel type MOS transistor P03 is connected to the output pad 40 through a resistor R02. That is, the output pad 40 corresponds to the output node of the output circuit 30. The resistors R01 and R02 are resistors for adjusting a rise time and a fall time of a signal to be output from the output pad 40 by changing resistance values of the resistors R01 and R02 while taking into consideration driving capabilities of the output transistors (N03, P03).

The output circuit 30 receives a signal through a node S2 from the second circuit 20 in the immediately preceding stage of the output circuit 30, and outputs the signal from the output pad 40. It is further set that the second circuit 20 receives a signal from the first circuit 10 through the node S1. That is, the first circuit 10 and the second circuit 20 are driving circuits for the output circuit 30. The first circuit 10 receives a power supply from the first power supply system. Thus, it may be said that a portion of the circuits for driving the output circuit 30 is connected to the different power supply system (the first circuit 10 corresponds to a first one of the driving circuits described above, while the second circuit 20 corresponds to a second one of the driving circuits described above).

Diodes D03 and D04 are respectively connected between the output pad 40 and the second power supply potential interconnect L03 and between the output pad 40 and the second ground potential interconnect L04 in order to protect the output transistors (N03, P03) from electrostatic breakdown. More specifically, a cathode of the diode D03 is connected to the second power supply potential interconnect L03, and an anode of the diode D03 is connected to the output pad 40. A cathode of the diode D04 is connected to the output pad 40, and an anode of the diode D04 is connected to the second ground potential interconnect L04.

In the semiconductor device shown in FIG. 7, not only when static electricity is applied to the fourth pad 54 but also when static electricity is applied to the output pad 40, the N-channel type MOS transistor N02 connected at a boundary between the first power supply system and the second power supply system may be broken down.

In a semiconductor device including a plurality of output terminals, a lot of output pads are formed on a semiconductor chip. When the position of each output pad is separated from the diodes D01 and D02 connected between the first ground potential interconnect L02 and the second ground potential interconnect L04 in that case, a resistance value on the second ground potential interconnect L04, which will form a discharge path, will increase. Influence of the increase in the resistance value therefore will come out.

Figure 8:
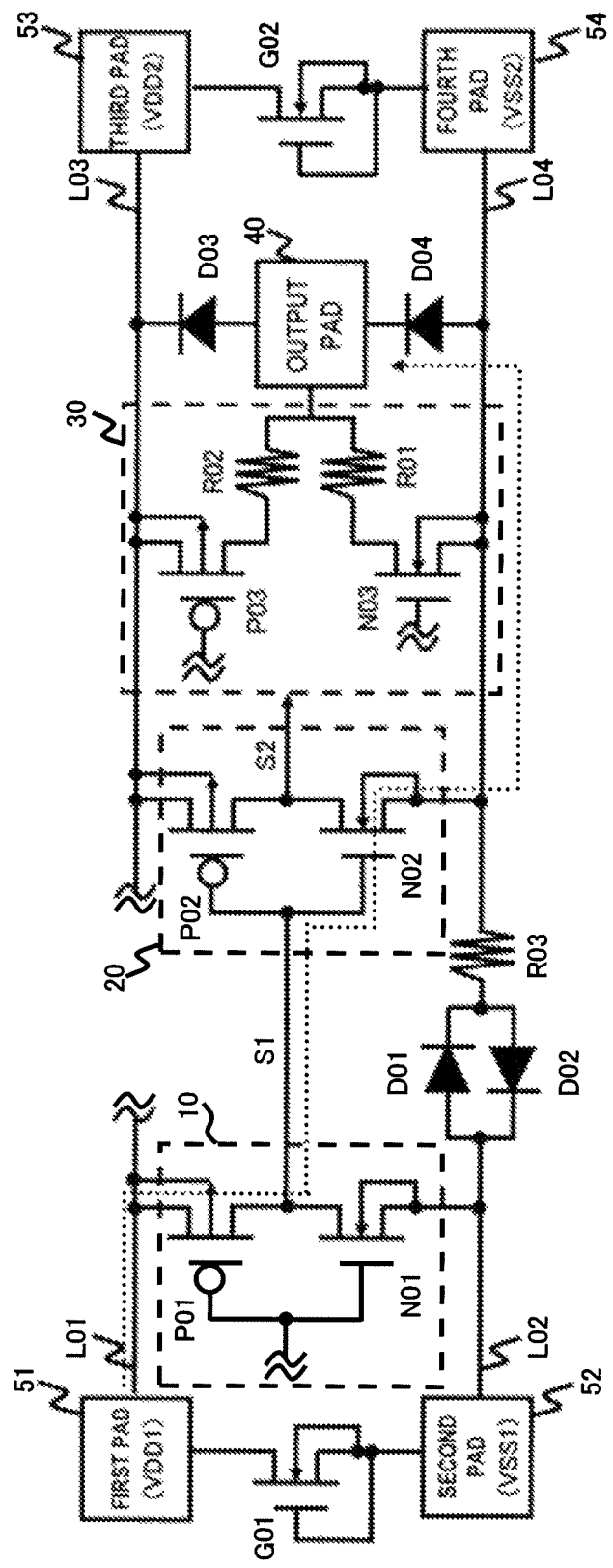
FIG. 8 is a diagram showing an example where influence of resistance on a second ground potential interconnect L04 comes out in the semiconductor device shown in FIG. 7.

FIG. 8 is a diagram showing an example where the influence of resistance on the second ground potential interconnect L04 has come out in the semiconductor device shown in FIG. 7. A resistor R03 in FIG. 8 shows the resistance on the second ground potential interconnect L04. It is assumed that the resistor R03 indicates a wiring resistance of the second ground potential interconnect L04 and a conduction resistance when the diode D01 or D02 discharges.

A case will be considered where static electricity having a negative potential is applied to the output pad 40 toward the first pad 51.

In this case, the static electricity is discharged through a discharge path from the diode D04 to the GGNMOS transistor G01 through the diode D01 (indicated by a dotted line shown in FIG. 7) when a resistance value of the resistor R03 is sufficiently low and the influence of the resistance on the second ground potential interconnect L04 does not come out. However, when the resistance value of the resistor R03 is high and the influence of the resistance on the second ground potential interconnect L04 comes out, a discharge path (indicated by a dotted line in FIG. 8) from the diode D04 to the P-channel type MOS transistor P01 through the N-channel type MOS transistor N02 and the node S1 is partially formed. As a result, the N-channel type MOS transistor N02 may be broken down by the static electricity.

Next, specific exemplary embodiments will be described in further detail, with reference to the drawings.

[First Exemplary Embodiment]

A first exemplary embodiment will be described in more detail, using the drawings.

Figure 9:
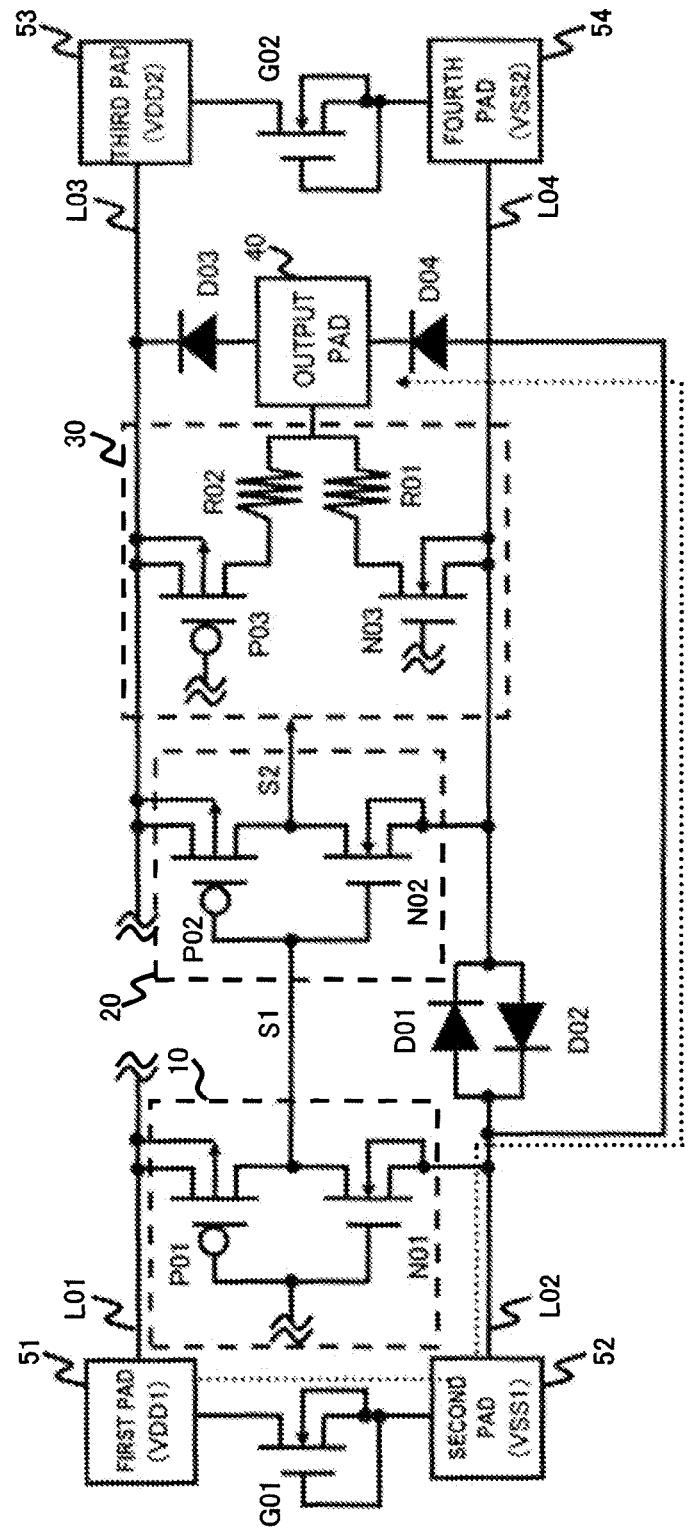
FIG. 9 is a diagram showing an example of an internal configuration of a semiconductor device 1 according to a first exemplary embodiment.

FIG. 9 is a diagram showing an example of an internal configuration of a semiconductor device 1 according to this exemplary embodiment. Referring to FIG. 9, components that are the same as those in FIG. 7 are denoted by the same reference symbols, and description of the components that are the same as those in FIG. 7 will be omitted.

The semiconductor device 1 shown in FIG. 9 is different from the semiconductor device shown in FIG. 7 in that the diode D04 is not connected to the second ground potential interconnect L04, but is connected to the first ground potential interconnect L02.

When static electricity having a negative potential is applied between the output pad 40 and the first pad 51 in the semiconductor device 1 shown in FIG. 9, the static electricity is discharged from the diode D04 to the ground voltage VSS1, and is then discharged to the power supply voltage VDD1 through the GGNMOS transistor G01 (through a path indicated by a dotted line in FIG. 9).

By connecting the diode D04 to the first ground potential interconnect L02 rather than the second ground potential interconnect L04 as described above, influence of resistance on the discharge path can be reduced. More specifically, when the static electricity having the negative potential is applied between the output pad 40 and the first pad 51 in the semiconductor device 1, the static electricity is not discharged through the diode D01. Thus, conduction resistance of the diode D01 does not come out as the resistance on the discharge path.

That is, the semiconductor device is not influenced by the conduction resistance of the diode D01 when the static electricity is discharged through the diode D01. Discharge capabilities of the discharge paths (using the diode D04, diode D01, and the GGNMOS transistor G01) are improved, and discharge through the node S1 does not occur. For that reason, the N-channel type MOS transistor N02 can be protected. As described above, the diodes D01 and D02 mainly assume a role of protecting an internal circuit from static electricity that is applied between the power supply pads. On the other hand, the diode D04 assumes a role of protecting the internal circuit from static electricity that is applied between the output pad and one of the power supply pads. Accordingly, by connecting one end of the diode D04 to the first ground potential interconnect L02, the internal circuit can be protected from the static electricity that is applied between the output pad and the one of the power supply pads.

[Second Exemplary Embodiment]

Next, a second exemplary embodiment will be described in detail with reference to the drawings.

Figure 10:
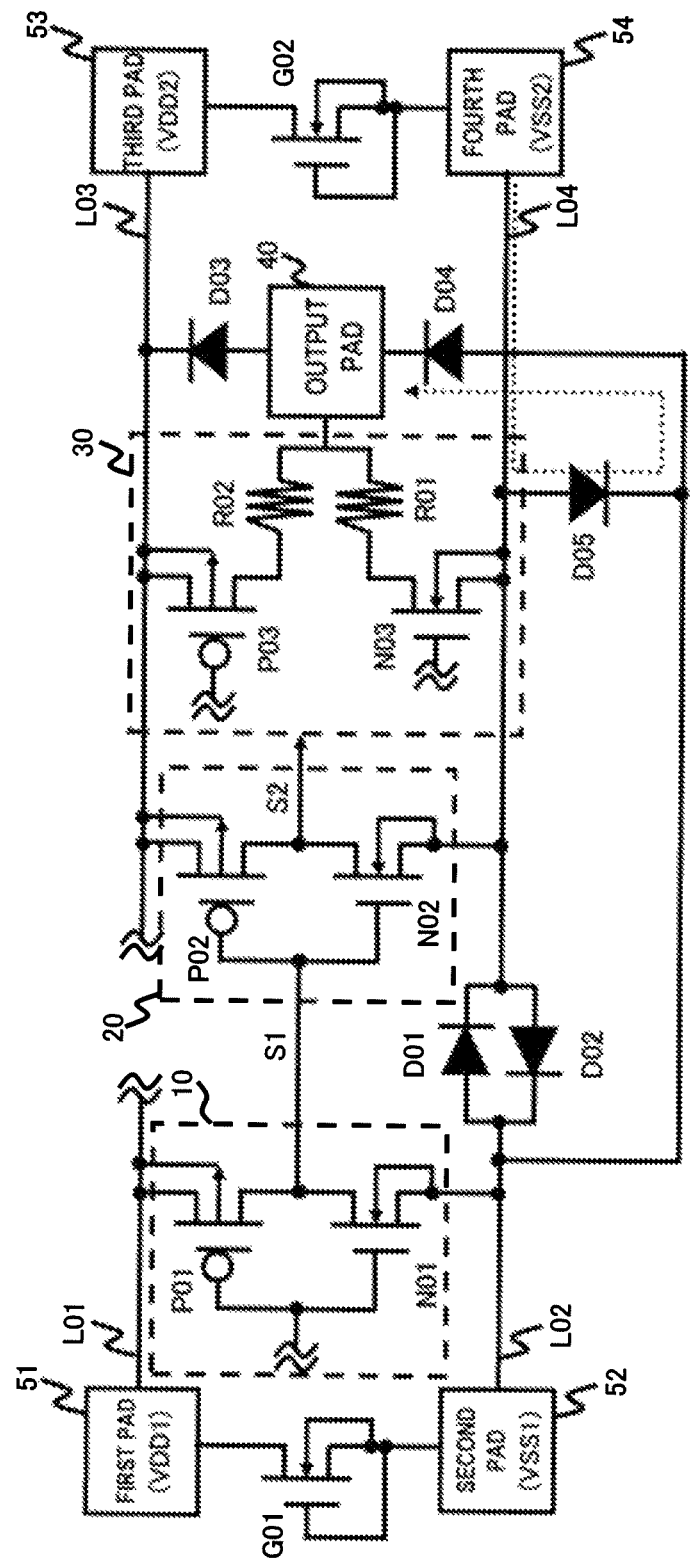
FIG. 10 is a diagram showing an example of an internal configuration of a semiconductor device 2 according to a second exemplary embodiment.

FIG. 10 is a diagram showing an example of an internal configuration of a semiconductor device 2 according to this exemplary embodiment. Referring to FIG. 10, components that are the same as those of FIG. 9 are denoted by the same reference symbols, and explanation of the components that are the same as those in FIG. 9 will be omitted.

In the semiconductor device 2 shown in FIG. 10, a diode D05 is added between the first ground potential interconnect L02 and the second ground potential interconnect L04 in the semiconductor device 1 shown in FIG. 9.

In the circuit diagram of the semiconductor device 2, the diode D05 is in the same connection state as the diode D02. The diode D02 is supposed to be disposed at a boundary between a first circuit region (such as the first circuit 10) that receives a power supply from the first power supply system and a second circuit region (such as the second circuit 20 and the output circuit 30) that receives a power supply from the second power supply system. The diode D05 is, however, preferably disposed in the vicinity of the output pad 40.

In the semiconductor device 1 according to the first exemplary embodiment, the connection destination of the diode D04 is changed to the first ground potential interconnect L02 from the second ground potential interconnect L04. When a resistance value of the resistor R01 connected to the N-channel type MOS transistor N03 is small in that case, discharge through the N-channel type MOS transistor N03 may occur due to the change in the connection. Then, in order to prevent such discharge, the diode D05 is added.

That is, when static electricity having a negative potential is applied between the output pad 40 and the fourth pad 54, the static electricity is discharged to the ground voltage VSS1 from the output pad 40 through the diode D04, and is then discharged to the ground voltage VSS2 through the diode D02 in the semiconductor device 1 in the first exemplary embodiment. Thus, discharge capability of the ground voltage VSS2 may be reduced (being influence by wiring resistance of the second ground potential interconnect L04).

When the discharge capability of the ground voltage VSS2 is reduced, discharge through the N-channel type MOS transistor N03 connected to the second ground potential interconnect L04 may newly occur. The N-channel type MOS transistor N03 may be therefore broken down. Then, the diode D05 connected between the first ground potential interconnect L02 and the second ground potential interconnect L04 is disposed in the vicinity of the output pad 40. That is, each of the diodes is disposed so that a distance between the diode D05 and the fourth pad 54 is shorter than a distance between each of the diodes D01 and D02 and the fourth pad 54. As a result, even if static electricity having a negative potential has been applied between the output pad 40 and the fourth pad 54, the static electricity is discharged to the ground voltage VSS2 through the diodes D04 and D05. Consequently, the N-channel type MOS transistor can be protected.

A plurality of output pads are present in the semiconductor device. Breakdown of the N-channel type MOS transistor N03 (output transistor) can be prevented not only by adding a diode corresponding to the diode D05 to each of the output pads but also by disposing the diode for every two or every four of the output pads.

Figure 11:
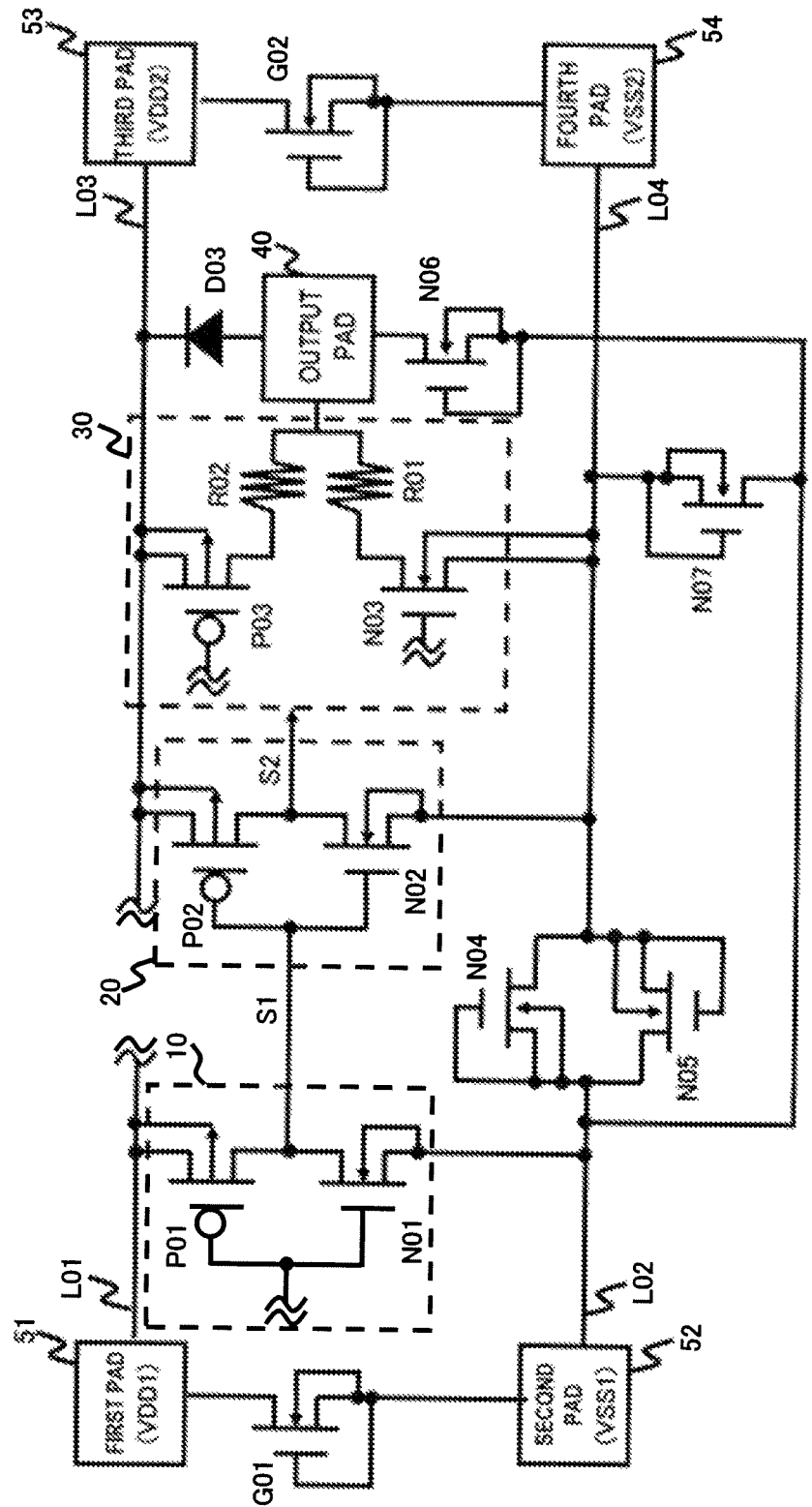
FIG. 11 is a diagram showing another example of the internal configuration of the semiconductor device 2 according to the second exemplary embodiment.

Herein, it is not always necessary to form the ESD protection circuit (second protection element) connected between the first ground potential interconnect L02 and the second ground potential interconnect L04 by using the diode elements. FIG. 11 is a diagram showing another example of the internal configuration of the semiconductor device 2 according to this exemplary embodiment. Referring to FIG. 11, components that are the same as those of FIG. 10 are denoted by the same reference symbols, and explanation of the components that are the same as those in FIG. 10 will be omitted.

As shown in FIG. 11, it is also possible to replace the diode D01 by an N-channel type MOS transistor N04 and replace the diode D02 by an N-channel type MOS transistor N05. A gate and a source of the N-channel type MOS transistor N04 are connected to the first ground potential interconnect L02, and a drain of the N-channel type MOS transistor N04 is connected to the second ground potential interconnect L04. Similarly, a gate and a source of the N-channel type MOS transistor N05 are connected to the second ground potential interconnect L04, and a drain of the N-channel type MOS transistor N05 is connected to the first ground potential interconnect L02. In the first exemplary embodiment as well, the ESD protection circuit (second protection element) connected between the first ground potential interconnect L02 and the second ground potential interconnect L04 can be formed of the N-channel type MOS transistors N04 and N05.

Further, an N-channel type MOS transistor N06 can be used as a protection element corresponding to the diode D04 (refer to FIG. 11). A source of the N-channel type MOS transistor N06 shown in FIG. 11 is connected to the first ground potential interconnect L02, and a drain of the N-channel type MOS transistor N06 is connected to the output pad 40. Further, a gate of the N-channel type MOS transistor N06 is connected to the first ground potential interconnect L02.

Still further, an N-channel type MOS transistor N07 can be used as a protection element corresponding to the diode D05 (refer to FIG. 11). A source of the N-channel type MOS transistor N07 shown in FIG. 11 is connected to the first ground potential interconnect L02, and a drain of the N-channel type MOS transistor N07 is connected to the second ground potential interconnect L04. Further, a gate of the N-channel type MOS transistor N07 is connected to the second ground potential interconnect L04.

Figure 12:
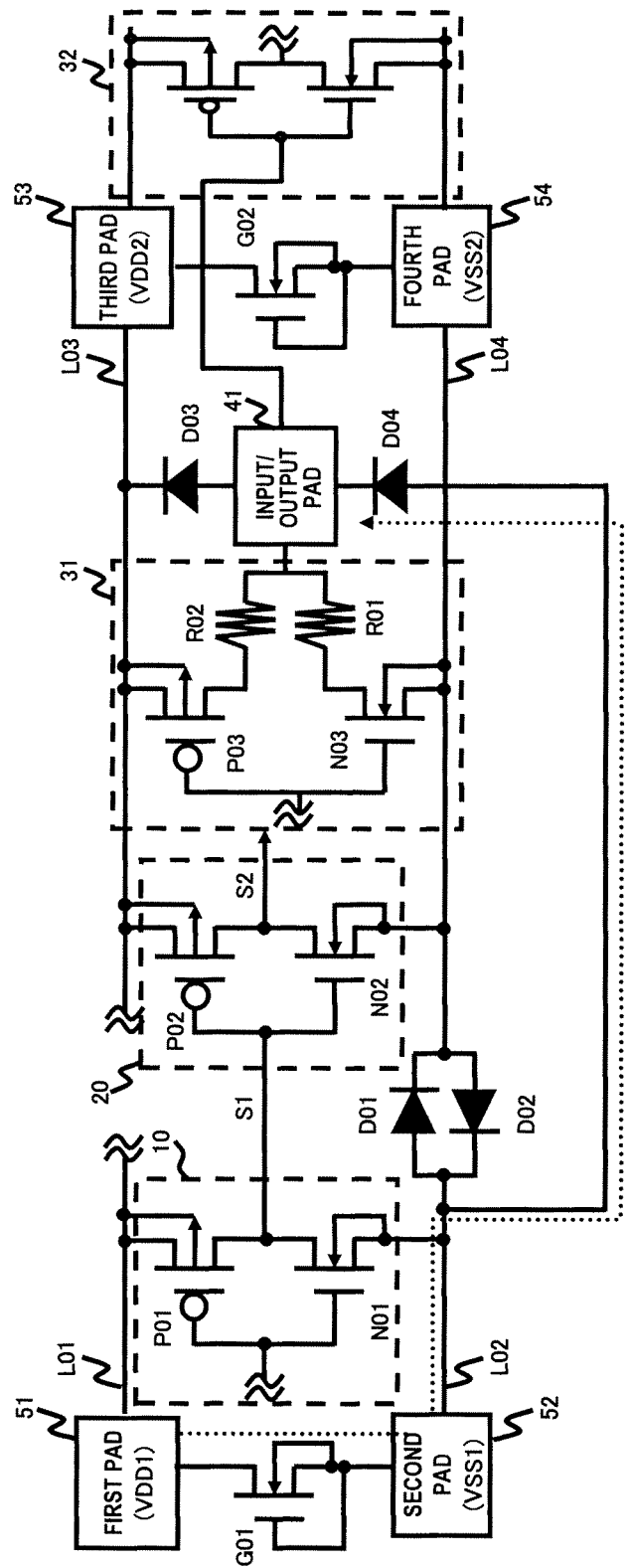
FIG. 12 is a diagram showing an example of a configuration in which an input buffer 32 is added to the semiconductor device 1.

A function as an input/output pad can also be given to the output pad 40. FIG. 12 is a diagram showing an example of a configuration in which an input buffer 32 is added to the semiconductor device 1 shown in FIG. 9. Referring to FIG. 12, components that are the same as those in FIG. 9 are denoted by the same reference symbols, and explanation of the components that are the same as those in FIG. 9 will be omitted. As shown in FIG. 12, an output buffer (output circuit) 31 and the input buffer (input circuit) 32 can also be connected to an input/output buffer 41. That is, an output node of the output buffer 31 and an input node of the input buffer 32 are connected through the input/output pad 41. As a result, an internal circuit can be protected from static electricity that is applied between the output pad 41 and one of the power supply pads. That is, by connecting one end of the diode D04 to the first ground potential interconnect L02, the internal circuit can be protected from the static electricity that is applied between the output pad 41 and the one of the power supply pad.

Each disclosure of the cited Patent Literatures listed above is incorporated herein by reference. Modifications and adjustments of the exemplary embodiments are possible within the scope of the overall disclosure (including claims) of the present invention, and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

What is claimed is:

1. A semiconductor device, comprising:
   a first power supply system configured with a first power supply voltage and a first ground voltage;
   a second power supply system configured with a second power supply voltage and a second ground voltage;
   an output circuit that receives a power supply from the second power supply system;
   a first driving circuit that receives a power supply from the first power supply system and outputs a signal for driving the output circuit; and
   a first protection element with one end thereof connected to an output node of the output circuit and with another end thereof being grounded to the first ground voltage,
   wherein the first protection element is configured to form a discharge path between the one end and the other end of the first protection element upon activation.

2. The semiconductor device according to claim 1, further comprising:
   a second protection element connected to include a current flow path from the first ground voltage to the second ground voltage without flowing through the first protection element, wherein
   the second protection element includes:
   a first diode element connected between the first ground voltage and the second ground voltage; and
   a second diode element connected between the first ground voltage and the second ground voltage in an opposite direction to the first diode element.

3. The semiconductor device according to claim 1, further comprising:
   a second protection element connected between the first ground voltage and the second ground voltage, wherein
   the second protection element includes:
   a first MOS (Metal-Oxide-Semiconductor) transistor connected between the first ground voltage and the second ground voltage, with a gate thereof connected to a first ground potential interconnect; and
   a second MOS transistor connected between the first ground voltage and the second ground voltage, with a gate thereof connected to a second ground potential interconnect.

4. The semiconductor device according to claim 1, wherein the output node is connected to the second power supply voltage through a third diode element; and the first protection element comprises a fourth diode element, a cathode of the fourth diode element is connected to the output node, and an anode of the fourth diode element is connected to the first ground voltage.

5. The semiconductor device according to claim 1, further comprising:
an input circuit that receives a power supply from the second power supply system, wherein
an input node of the input circuit and the output node of the output circuit are connected through an input/output pad.

6. A semiconductor device, comprising:
first to fifth pads disposed on a semiconductor substrate;
a first circuit that is driven by a potential difference between the first and second pads, the first circuit controlling a potential of a first node;
a second circuit that is driven by a potential difference between the third and fourth pads, the second circuit controlling a potential of the fifth pad;
a first protection element connected between the second pad and the fifth pad; and
a second protective element that has one end connected to the fifth pad and another end connected to the second pad without intervention of the first protection element.

7. The semiconductor device according to claim 6, wherein the second circuit controls the potential of the fifth pad in response to the potential of the first node.

8. A semiconductor device comprising:
first to fifth pads disposed on a semiconductor substrate;
a first circuit that is driven by a potential difference between the first and second pads, the first circuit controlling a potential of a first node;
a second circuit that is driven by a potential difference between the third and fourth pads, the second circuit controlling a potential of the fifth pad;
a first protection element connected between the second pad and the fourth pad; and
a second protective element that has one end connected to the fifth pad and another end connected to the second pad without an intervention of the first protective element.

9. The device according to claim 8, further comprising a third protective element that has one end connected to the fourth pad without an intervention of the first protective element and another end connected to the another end of the second protective element.

10. The device according to claim 8, wherein the second protective element comprises a first diode that has an anode electrode serving as the one end and a cathode serving as the another end.

11. The device according to claim 8, wherein the first protective element comprises a second diode that has an anode connected to the second pad and a cathode connected to the fourth pad and a third diode that has an anode connected to the fourth pad and a cathode connected to the second pad.

12. The device according to claim 8, wherein the first protective element comprises a first transistor that has a source-drain path connected between the second and fourth pads and a gate connected to the second pad and a second transistor that has a source-drain path connected between the second and fourth pads and a gate connected to the fourth pad.

13. The device according to claim 9, wherein the third protective element comprises a diode that has an anode serving as the one end and a cathode serving as the another end.

14. The device according to claim 13, wherein the third protective element comprises a transistor that has a source-drain path connected between the fourth pad and the another end of the second protective element and a gate connected to the fourth pad.

15. The device according to claim 8, further comprising a first additional protective element connected between the third and fifth pads.

16. The device according to claim 15, further comprising a second additional protective element connected between the first and second pads and a third additional protective element connected between third and fourth pads.

17. The device according to claim 8, wherein the first and third pads are separated from each other and no protective element is provided therebetween.

18. The device according to claim 8, further comprising a third circuit that is driven by the potential difference between the third and fourth pads and intervenes between the first node and the second circuit.

19. The device according to claim 18, wherein the third circuit comprises a first output transistor connected between the third and fifth pads and a second transistor connected between the fifth and fourth pads.

20. The device according to claim 18, further comprising a fourth circuit that is driven by the potential difference between the third and fourth pads and is connected to the fifth pad.

21. The semiconductor device according to claim 3, wherein the second protection element is connected between the first ground voltage and the second ground voltage without an intervention of the first protective element.

22. The semiconductor device according to claim 1, wherein the another end of the first protection element is directly connected to the first ground voltage.

* * * * *